US006970770B2

(12) United States Patent
Iljima et al.

(10) Patent No.: US 6,970,770 B2
(45) Date of Patent: Nov. 29, 2005

(54) CLUSTER TOOL AND METHOD FOR CONTROLLING TRANSPORT

(75) Inventors: Kiyohito Iljima, Nirasaki (JP); Seiichi Kaise, Nirasaki (JP); Keiko Takahashi, Nirasaki (JP); Akira Obi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/473,135

(22) PCT Filed: Apr. 2, 2002

(86) PCT No.: PCT/JP02/03283

§ 371 (c)(1),
(2), (4) Date: Oct. 6, 2003

(87) PCT Pub. No.: WO02/084731

PCT Pub. Date: Oct. 24, 2002

(65) Prior Publication Data

US 2004/0117059 A1 Jun. 17, 2004

(30) Foreign Application Priority Data

Apr. 6, 2001 (JP) ............................ 2001-108926

(51) Int. Cl.[7] ................................................ G06F 7/00
(52) U.S. Cl. ...................... 700/218; 414/805; 414/217; 414/939
(58) Field of Search ................................ 700/218, 213, 700/214; 414/217, 935, 939, 940, 941, 805

(56) References Cited

U.S. PATENT DOCUMENTS

| | | | | |
|---|---|---|---|---|
| 5,019,233 A * | 5/1991 | Blake et al. | ........... | 204/192.12 |
| 5,357,115 A * | 10/1994 | Asakawa et al. | ...... | 250/442.11 |
| 5,388,944 A * | 2/1995 | Takanabe et al. | ........... | 414/217 |
| 5,478,195 A * | 12/1995 | Usami | ........................ | 414/805 |
| 5,685,684 A * | 11/1997 | Kato et al. | .................. | 414/217 |
| 6,244,811 B1 * | 6/2001 | Kroeker et al. | ............. | 414/217 |
| 6,428,262 B1 * | 8/2002 | Vanderpot et al. | .......... | 414/217 |
| 6,481,956 B1 * | 11/2002 | Hofmeister | ................. | 414/806 |
| 6,519,504 B1 * | 2/2003 | Soraoka et al. | ............. | 700/228 |
| 6,719,517 B2 * | 4/2004 | Beaulieu et al. | ............ | 414/217 |
| 6,722,835 B1 * | 4/2004 | Stevens et al. | ............ | 414/217 |
| 6,746,195 B2 * | 6/2004 | Shirai | ......................... | 414/217 |

FOREIGN PATENT DOCUMENTS

| | | |
|---|---|---|
| JP | 2000-332083 | 11/2000 |
| JP | 2001-53131 | 2/2001 |
| JP | 2001-358195 | 12/2001 |

* cited by examiner

*Primary Examiner*—Khoi H. Tran
(74) *Attorney, Agent, or Firm*—Oblon, Spivak, McClelland, Maier & Neustadt, P.C.

(57) ABSTRACT

At a time Tp when a wafer W is transferred into either a load lock chamber LL1 or LL2, periods PSL for the load lock chambers LL1 and LL2 to get ready to permit a transfer of a next wafer W thereinto are calculated based on a timing for exchange of wafers W between the load lock chamber LL1 or LL2 and a loader module LM. When the periods PSL are calculated, a loader arm LA1 or LA2 selects a next wafer W having the shortest period to get ready to be transferable into the load lock chamber LL1 or LL2, from load ports LP1 to LP3. This improves transfer delay in a cluster tool provided with the load lock chambers.

10 Claims, 4 Drawing Sheets

CLUSTER TOOL AND METHOD FOR CONTROLLING TRANSPORT

TECHNICAL FIELD

The present invention relates to a cluster tool and a transfer control method.

BACKGROUND ART

In a conventional cluster tool, processing residual periods for wafers which are being processed at present in process chambers are calculated respectively, and selection of a wafer to be taken out of a load port is made in such a manner that the next wafer is transferred to a process chamber having the shortest processing residual period.

However, in a cluster tool provided with load lock chambers, transfer to each of the process chambers is performed via the load lock chamber. In the load lock chamber, a wafer is delivered between a loader module and the load lock chamber and a wafer is delivered between the load lock chamber and the process chamber, and therefore supply and exhaust of air responding to the degree of vacuum in the loader module or the process chamber are repeated. For this reason, selection of a wafer to be taken out of the load port in consideration only of the processing residual period in the process chamber may rather increase a delay in transfer because there occurs waiting for transfer due to processing such as supply or exhaust of air in the load lock chamber.

Further, in the case in which transfers of wafers having different recipe execution periods are performed, when selection of a wafer is made in consideration only of their processing residual periods, a transfer of one having a shorter recipe execution period may be kept waiting, bringing about a problem that the throughput as a whole system is decreased.

DISCLOSURE OF THE INVENTION

An object of the present invention is to provide a cluster tool provided with load lock chambers in which transfer delay can be improved and a transfer control method thereof.

To solve the above-described problems, the present invention is characterized by comprising: a plurality of process chambers for performing process processing for objects to be processed; load lock chambers coupled to the process chambers respectively for transferring the objects to be processed to the process chambers; a loader module coupled to the load lock chambers for transferring the objects to be processed to the load lock chambers; and a transfer control unit for selecting an object to be processed that is to be transferred next by the loader module, based on timings for when the load lock chambers get ready to permit transfers of the objects to be processed thereto.

This makes it possible to calculate periods for the load lock chambers to get ready to permit a transfer of the next wafer thereinto, in consideration of the processing periods in the load lock chambers. Therefore, in the case in which there are a process chamber having a short process residual period and a process chamber having a long process residual period, if selection of the processing chamber having a short process residual period rather increases the transfer delay due to a delay in processing in the load lock chamber coupled thereto, it is possible to select the process chamber having a long process residual period but coupled to the load lock chamber in which processing will be finished earlier, whereby the transfer delay can be reduced.

Further, the present invention is characterized in that the transfer control unit comprises: a transfer period calculating unit for calculating a period for each of the load lock chambers to get ready to permit a next transfer thereto, when the object to be processed is transferred into any one of the load lock chambers; and a selecting unit for selecting, as an object to be processed that is to be transferred next, an object to be processed having the shortest period to get ready to be transferable.

This makes it possible to select an object to be processed having the shortest period to get ready to be transferable to a load lock chamber every time an object to be processed is transferred into any one of the load lock chambers, so that transfer delay when a plurality of process chambers are provided can be reduced.

Further, the present invention is characterized by comprising: a plurality of process chambers for performing process processing for objects to be processed; load lock chambers coupled to the process chambers respectively for transferring the objects to be processed to the process chambers; a loader module coupled to the load lock chambers for transferring the objects to be processed to the load lock chambers; and a transfer control unit for selecting an object to be processed that is to be transferred next by the loader module, based on timings for when the process chambers get ready to permit transfers of the objects to be processed thereto.

This makes it possible to calculate periods for the process chambers to get ready to permit a transfer of a next wafer thereinto, in consideration of the processing periods in the load lock chambers. Therefore, when a load lock chamber has a short period to get ready to permit a transfer of the wafer thereinto but a long period until the wafer is further transferred into its process chamber after transferred into the load lock chamber, it is possible to select a load lock chamber having a long period to get ready to permit a transfer of the wafer thereinto but a short period until the wafer is further transferred into its process chamber after transferred into the load lock chamber. As a result, a state in which waiting state for transfer into any of the load lock chambers continues for a long time and thus the loader module is free for a long time can be prevented to improve the throughput as a whole system.

Further, the present invention is characterized in that the transfer control unit comprises: a transfer period calculating unit for calculating a period for each of the process chambers to get ready to permit a next transfer thereto, when the object to be processed is transferred into any one of the load lock chambers; and a selecting unit for selecting, as an object to be processed that is to be transferred next, an object to be processed having the shortest period to get ready to be transferable.

This makes it possible to select an object to be processed having the shortest period to get ready to be transferable to a process chamber every time an object to be processed is transferred into any one of the load lock chambers, so that transfer delay when a plurality of process chambers are provided can be reduced.

Further, the present invention is characterized in that the loader module is provided with a positioning mechanism for positioning the object to be processed, and that the object to be processed that is to be transferred next selected by the transfer control unit is positioned by the positioning mechanism, thereafter transferred to the front of the load lock chamber, and kept waiting.

Further, according to the present invention, a transfer control method of transferring objects to be processed via load lock chambers to a plurality of process chambers provided, is characterized by comprising: selecting an object to be processed that is to be transferred next based on timings for when the load lock chambers get ready to permit transfers of the objects to be processed thereto.

This makes it possible to decide the transfer sequence in consideration of not only the processing residual periods in the process chambers but also the processing periods in the load lock chambers, so that transfer delay can be reduced.

Further, according to the present invention, a transfer control method of transferring objects to be processed via load lock chambers to a plurality of process chambers provided, is characterized by comprising: selecting an object to be processed that is to be transferred next based on timings for when the process chambers get ready to permit transfers of the objects to be processed thereto.

This makes it possible to calculate periods for the process chambers to get ready to perform processing in consideration of the processing periods in the load lock chambers, so that throughput as a whole system can be improved.

Furthermore, the present invention is characterized by further comprising: positioning the selected object to be processed that is to be transferred next by a positioning mechanism, thereafter transferring the object to the front of the load lock chamber, and keeping the object waiting.

BEST MODE FOR CARRYING OUT THE INVENTION

Hereinafter, a cluster tool and a transfer control method according to an embodiment of the present invention will be explained with reference to the drawings.

Figure 1:
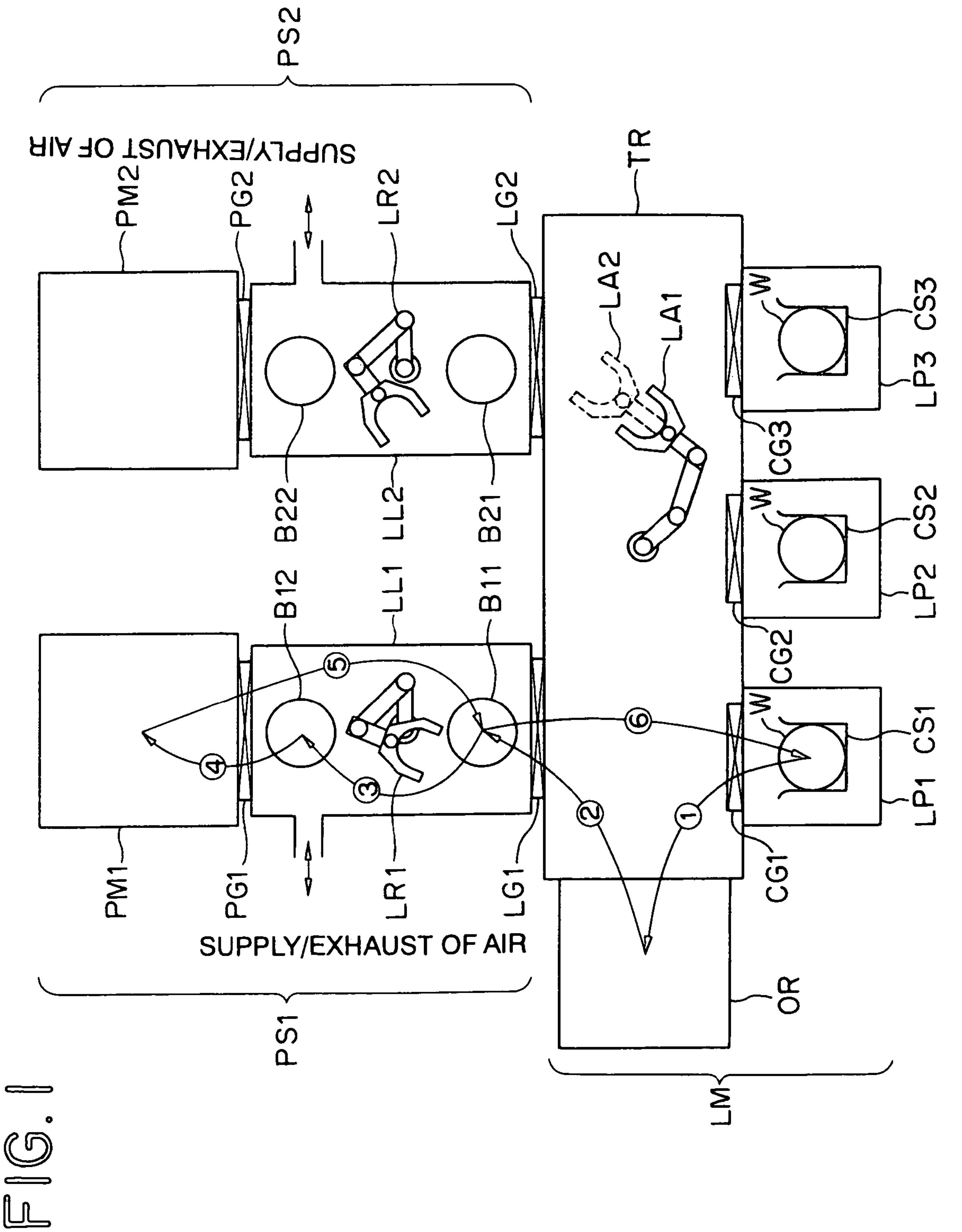
FIG. 1 is a cross-sectional view showing a schematic configuration of a cluster tool according to an embodiment of the present invention.
Figure 2A:
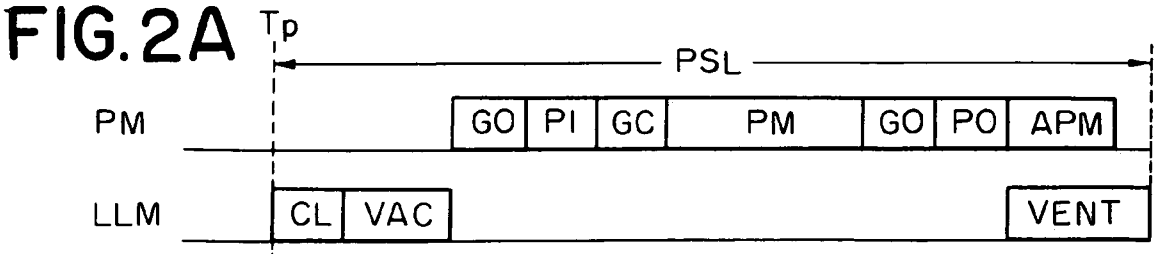
FIGS. 2(*a*) to 2(*e*) are diagrams each showing a method of calculating a transfer-in timing according to a first embodiment of the present invention.
Figure 2B:
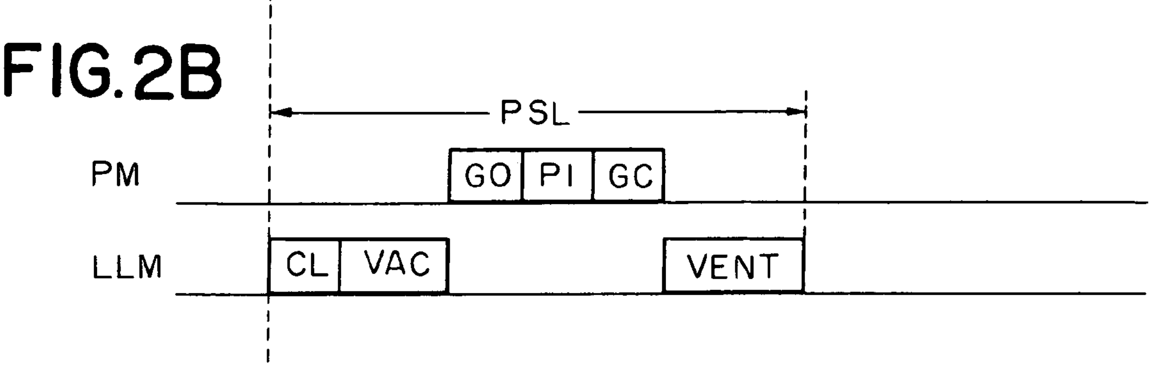
Figure 2C:
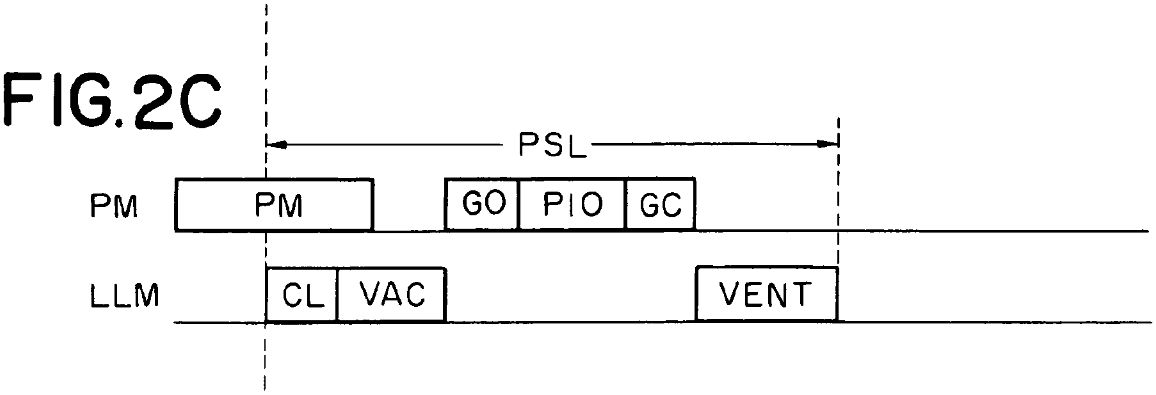
Figure 2D:
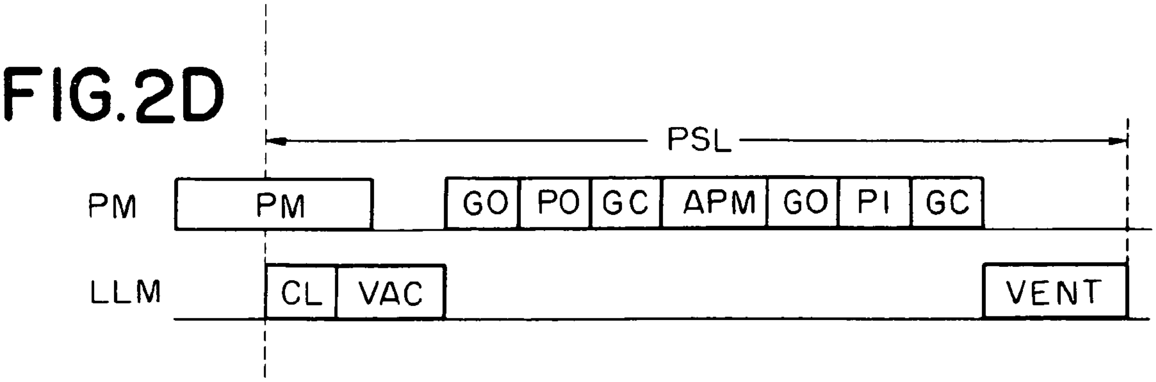
Figure 2E:
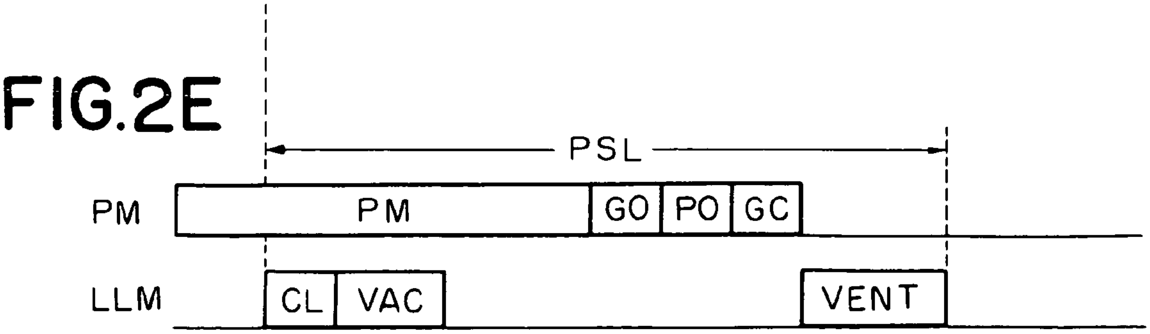

FIG. 1 is a cross-sectional view showing a schematic configuration of a cluster tool according to an embodiment of the present invention. In FIG. 1, in a loader module LM, load ports LP1 to LP3 which accommodate wafers W, a transfer chamber TR in which the wafers W are transferred, and an orienter OR which positions the wafers W, are provided. In the load ports LP1 to LP3, cassettes or FOUPs CS1 to CS3 which accommodate unprocessed wafers W and processed wafers W, are located.

Further, these load ports LP1 to LP3 can also be set as ports for dummy wafers in which cassettes or the like accommodating dummy wafers are located.

To the transfer chamber TR, the orienter OR is coupled, process ships PS1 and PS2 are coupled via load lock doors LG1 and LG2, and further the load ports LP1 to LP3 are coupled via load port doors CG1 to CG3.

In the transfer chamber TR, loader arms LA1 and LA2 in a two-tier structure are provided, and the loader arms LA1 and LA2 perform transfers of wafers W among the load ports LP1 to LP3, load lock chambers LL1 and LL2, and the orienter OR (transfers (1), (2), and (6) in FIG. 1). Here, the loader arms LA1 and LA2 are structured in two tiers so as to make it possible that one of the loader arms LA1 and LA2 transfers a wafer W in, while the other loader arm LA1 or LA2 transfers a wafer W out, thereby enabling performance of efficient exchange of the wafers W.

In the process ships PS1 and PS2, the load lock chambers LL1 and LL2 and process chambers PM1 and PM2 are provided, and the load lock chambers LL1 and LL2 and the process chambers PM1 and PM2 are coupled to each other via process gates PG1 and PG2. In the load lock chambers LL1 and LL2, wafer mounting tables B11, B12, B21, and B22, and load lock arms LR1 and LR2 are provided respectively, so that wafers W transferred thereinto from the loader module LM and wafers W to be transferred out of the load lock chambers LL1 and LL2 are mounted on the wafer mounting tables B12 and B22. On the other hand, wafers W to be transferred into the process chambers PM1 and PM2 are mounted on the wafer mounting tables B11 and B21. Besides, the load lock arms LR1 and LR2 perform transfers of wafers W between the load lock chambers LL1 and LL2 and the process chambers PM1 and PM2 (transfers (3), (4), and (5) in FIG. 1).

To improve the efficiency of transfer, the transfer chamber TR is open to atmospheric air, and the load port doors CG1 to CG3 are kept open. Meanwhile, the process chambers PM1 and PM2 are kept at a predetermined degree of vacuum in order to prevent contamination. Accordingly, in the load lock chambers LL1 and LL2, supply or exhaust of air is performed to respond to respective degrees of vacuum, in accordance with transfers to/from the transfer chamber TR or the process chambers PM1 and PM2. Hereinafter, a transfer sequence will be explained with taking a case of performance of a transfer between the load port LP1 and the process ship PS1 as an example.

First, the loader arm LA1 or LA2 takes out a wafer W mounted on the load port LP1 and transfers it into the orienter OR ((1)).

When the wafer W is transferred in, the orienter OR positions the wafer W. After the positioning of the wafer W is finished, the loader arm LA1 or LA2 takes the wafer W out of the orienter OR and transfers it to the front of the load lock chamber LL1 and waits there. Then, when opening to atmospheric air of the load lock chamber LL1 is completed, the load lock door LG1 of the load lock chamber LL1 is opened. When the load lock door LG1 is opened, the loader arm LA1 or LA2 transfers the wafer W into the load lock chamber LL1 and mounts it on the wafer mounting table B11 ((2)).

When the wafer W is mounted on the mounting table B11, the load lock door LG1 is closed, exhaust of air in the load lock chamber LL1 is performed, and the load lock arm LR1 transfers the wafer W mounted on the wafer mounting table B11 to the wafer mounting table B12 ((3)).

When the wafer W is transferred to the wafer mounting table B12 and the process chamber PM1 gets ready to permit a transfer of the wafer W thereinto, the process gate PG1 of the process chamber PM1 is opened, and the load lock arm LR1 transfers the wafer W mounted on the wafer mounting table B12 into the process chamber PM1 ((4)).

When, the wafer W is transferred into the process chamber PM1, the process gate PG1 is closed, and the wafer W is processed in the process chamber PM1. When the processing for the wafer W in the process chamber PM1 is completed and the load lock chamber LL1 gets ready to permit a transfer-out of the wafer W thereto, the process gate PG1 is opened, and the load lock arm LR1 transfers the wafer W placed in the process chamber PM1 to the wafer mounting table B11 ((5)).

Then, the process gate PG1 is closed, and the load lock chamber LL1 is opened to atmospheric air. After completion of the opening to atmospheric air of the load lock chamber LL1, the load lock door LG1 is opened in accordance with a transfer-in timing for the next wafer W, and one of the loader arms LA1 and LA2 transfers out the wafer W mounted on the wafer mounting table B11 to the load port LP1 ((6)), while the other loader arm LA1 or LA2 transfers the next wafer W, which has been positioned in the orienter OR, into the load lock chamber LL1. ((2)).

It should be noted that the load lock arms LR1 and LR2 and so on which transfer wafers W perform a probe action for sections where the wafers W possibly exist, at the time of restore of the apparatus after a stop of operation in order to confirm that there is no wafer W left in the sections. As a result of performance of this probe action, if a wafer W is still mounted on the load lock arm LR1 or LR2, the wafer W is to be collected, whereby processing thereafter can be performed safely.

FIGS. 2(*a*) to 2(*e*) are diagrams each showing a method of calculating a transfer-in timing according to a first embodiment of the present invention. Note that such a calculation is conducted by a not-shown transfer control unit comprising a CPU and so on.

In the first embodiment, at a time Tp when a wafer W is transferred into either the load lock chamber LL1 or LL2, periods PSL for the load lock chambers LL1 and LL2 to get ready to permit a transfer of the next wafer W thereinto are calculated based on a timing for exchange of wafers W between the load lock chamber LL1 or LL2 and the loader module LM. When the periods PSL are calculated, the loader arm LA1 or LA2 selects the next wafer W having the shortest period to get ready to be transferable into the load lock chamber LL1 or LL2, from the load ports LP1 to LP3. This period PSL is calculated as follows in accordance with the number of wafers W transferred in the process ship PS1 or PS2.

It should be noted that periods associated with transfers are defined as follows:

CL: closing period of the load lock door LG1 or LG2

VAC: air exhausting period of the load lock chamber LL1 or LL2

GO: opening period of the process gate PG1 or PG2

GC: closing period of the process gate PG1 or PG2

PI: transfer-in period from the load lock chamber LL1 or LL2 to the process chamber PM1 or PM2

PO: transfer-out period from the process chamber PM1 or PM2 to the load lock chamber LL1 or LL2

PIO: period of exchanging wafers between the process chamber PM1 or PM2 and the load lock chamber LL1 or LL2

PM: processing period in the process chamber PM1 or PM2

ΔPM: processing residual period in the process chamber PM1 or PM2

VENT: air-supply period

APM: after-processing (after-recipe) period in the process chamber PM1 or PM2

First, a case in which one wafer W is transferred in the process ship PS1 or PS2 will be explained.

In FIG. 2(*a*), at the time of transfer-in of a wafer W, the period to get ready to permit a transfer-in of the next wafer W is a period during which a wafer W transferred from the loader module LM into the process ship PS1 or PS2 is processed in the process chamber PM1 or PM2, the processed wafer W is mounted on the wafer mounting table B11 or B21, and the load lock chamber LL1 or LL2 is opened to atmospheric air.

Accordingly, the period PSL in this case is $$PSL=CL+\mathrm{VAC}+GO+PI+GC+PM+GO+PO+\mathrm{Max}(\mathrm{VENT}, APM) \quad (1).$$

Incidentally, Max ( ) represents selection of a greater value. It should be noted that, in the equation (1), the reason why the period of transfer of the wafer W from the wafer mounting table B11 or B21 to the wafer mounting table B12 or B22 is not added is that the transfer from the wafer mounting table B11 or B21 to the wafer mounting table B12 or B22 ((3)) is performed during the exhaust of air in the load lock chamber LL1 or LL2, and therefore this transfer period is behind the air exhausting period VAC of the load lock chamber LL1 or LL2 (the same applies to the following).

Next, a case in which two wafers W are transferred in the process ship PS1 or PS2 will be explained. In the following explanation, it is assumed that each of the process ships PS1 and PS2 can accommodate up to two wafers W at the same time, that each of the process chambers PM1 and PM2 can accommodate only one wafer W, and that each of the load lock chambers LL1 and LL2 can accommodate only one wafer W.

First, in FIG. 2(*b*), in a state in which there is no wafer W in the process ship PS1 or PS2, when a wafer W transferred into the process ship PS1 or PS2 is transferred into the process chamber PM1 or PM2, the next wafer W can be transferred into the load lock chamber LL1 or LL2. Therefore, at the time of transfer-in of the wafer W, the period to get ready to permit a transfer-in of the next wafer is a period during which the wafer W transferred from the loader module LM into the process ship PS1 or PS2 is transferred into the process chamber PM1 or PM2, and the load lock chamber LL1 or LL2 is opened to atmospheric air.

Accordingly, the period PSL in this case is $$PSL=CL+\mathrm{VAC}+GO+PI+GC+\mathrm{VENT} \quad (2).$$

Next, in FIG. 2(*c*), in a state in which there are two wafers W in the process ship PS1 or PS2, it is necessary to exchange a wafer to be transferred into the process ship PS1 or PS2 with the processed wafer W in the process ship PS1 or PS2 in order to transfer the wafer W from the loader module LM into the process ship PS1 or PS2. Therefore, at the time of transfer-in of a wafer W, the period to get ready to permit a transfer-in of the next wafer W is a period during which the processing for the wafer W transferred in the process chamber PM1 or PM2 is finished, the wafer W transferred from the loader module LM into the process ship PS1 or PS2 is exchanged with the wafer W which has been processed in the process chamber PM1 or PM2, and the load lock chamber LL1 or LL2 is opened to atmospheric air. Here, in the process ship PS1 or PS2, the process processing for the wafer W in the process chamber PM1 or PM2 can be performed concurrently with processing such as exhaust of air in the load lock chamber LL1 or LL2.

Accordingly, the period PSL in this case is $$PSL=\mathrm{Max}((CL+VAC),\Delta PM)+GO+PIO+GC+\mathrm{VENT} \quad (3).$$

Next, in FIG. 2(*d*), in a state in which there are two wafers W in the process ship PS1 or PS2, when the after-processing is performed for the process chamber PM1 or PM2, it is necessary to add a period required for this after-processing to the equation (3).

Accordingly, the period PSL in this case is $$PSL=\mathrm{Max}((CL+VAC),\Delta PM)+GO+PO+GC+APM+GO+PI+GC+\mathrm{VENT} \quad (4).$$

Next, in FIG. 2(*e*), in a state in which there is one wafer W in the process ship PS1 or PS2, the period PSL is a period for the process ship PS1 or PS2 to get ready to permit a transfer-out of the last wafer W in the process ship PS1 or PS2 therefrom.

Accordingly, the period PSL in this case is $$PSL=\text{Max}((CL+VAC),\Delta PM)+GO+PO+GC+\text{VENT} \quad (5).$$

When the period PSL is calculated by the above calculation method, a period for each of the process ships PS1 and PS2 to get ready to permit a transfer of the next wafer thereinto is calculated based on the period PSL. Then, when there is no wafer W in the orienter OR, the loader arm LA1 or LA2 takes out a wafer W having the shortest period to get ready to be transferable thereinto from one of the load ports LP1 to LP3, and transfers the taken out wafer W into the orienter OR.

Alternatively, when there is a wafer W in the orienter OR, a period PSL after the wafer W on the orienter OR is transferred into the load lock chamber LL1 or LL2 is recalculated. Then, the loader arm LA1 or LA2 takes out a wafer W having the shortest period to get ready to be transferable thereinto from one of the load ports LP1 to LP3, and transfers the taken out wafer W into the orienter OR.

Here, the period for each of the process ships PS1 and PS2 to get ready to permit transfer thereinto is recalculated, if, for example, it is assumed that the wafer W is transferred into the process ship PS1, processing such as supply or exhaust of air in the load lock chamber LL2 has already advanced in the process ship PS2, and therefore the period for the process ship PS2 to get ready to permit transfer thereinto is reduced only by the advance. Therefore, the period PSL calculated by the above-described method needs to be corrected. A period PSL' that is the period PSL after the correction excluding the period at a destination can be calculated by the following equation.

$$PSL'=PSL-TR(in) \quad (6)$$

Note that TR(in) represents the period for the load lock chamber LL1 or LL2 that is the destination to get ready to permit a transfer of the wafer W on the orienter OR thereinto, and can be obtained as follows when there is a wafer W in the process ship PS1 or PS2.

i) In the case of transfer of two wafers W in the process ship PS1 or PS2, when there is an unprocessed wafer W in the load lock chamber LL1 or LL2

In the case where PSL>TR(LM): PMx=PMs

TR(in)=PSL at destination

In the case where PSL<TR(LM): PMx=PMs −TR(LM)

(however, it is 0 when PMs<TR(LM))

TR(in)=TR(LM)

Note that PMx represents the processing residual period in the process chamber PM1 or PM2 in consideration of processing in the load lock chamber LL1 or LL2, and therefore when obtaining PSL at the destination, ΔPM in the equations (3) to (5) is replaced with PMx. Besides, TR(LM) represents the transfer period from one of the load ports LP1 to LP3 to the load lock chamber LL1 or LL2, and can be expressed, for example, by the period of transfer from the remotest load port LP3 via the orienter OR to the load lock chamber LL1 or LL2. PMs represents the processing residual period in the process chamber PM1 or PM2 after the wafer W is exchanged with another and transferred to the process chamber PM1 or PM2 and the load lock chamber LL1 or LL2 is opened to atmospheric air, and can be obtained as follows:

In the case where PMt>VENT: PMs=PMt−VENT

In the case where PMt<VENT: PMs=0

Note that PMt represents the processing period in the process chamber PM1 or PM2 for the wafer W before processed in the load lock chamber LL1 or LL2.

ii) In the case of transfer of two wafers W in the process ship PS1 or PS2, when there is a processed wafer W in the load lock Chamber LL1 or LL2, In the case where PSL>TR(LM): TR(in)=PSL at destination In the case where PSL<TR(LM): TR(in)=TR(LM)

In the case where PMc>TR(in): PMx=PMc−TR(in)

In the case where TR(in) <PMc: PMx=0

Note that PMc represents the processing residual period in the process chamber PM1 or PM2 for the wafer W in the process chamber PM1 or PM2.

It should be noted that when there is no wafer W in the process chamber PM1 or PM2, calculation is conducted with the processing residual period ΔPM in the process chamber PM1 or PM2 as 0.

iii)In the case of transfer of one wafer W in the process ship PS1 or PS2

In the case where PSL>TR(LM): TR(in)=PSL at destination

In the case where PSL<TR(LM): TR(in)=TR(LM)

This enables the transfer sequence of a wafer W to be decided in consideration of not only the processing residual period ΔPM in the process chamber PM1 or PM2 but also the processing period in the load lock chamber LL1 or LL2, thereby reducing delay in transfer.

Figure 3:
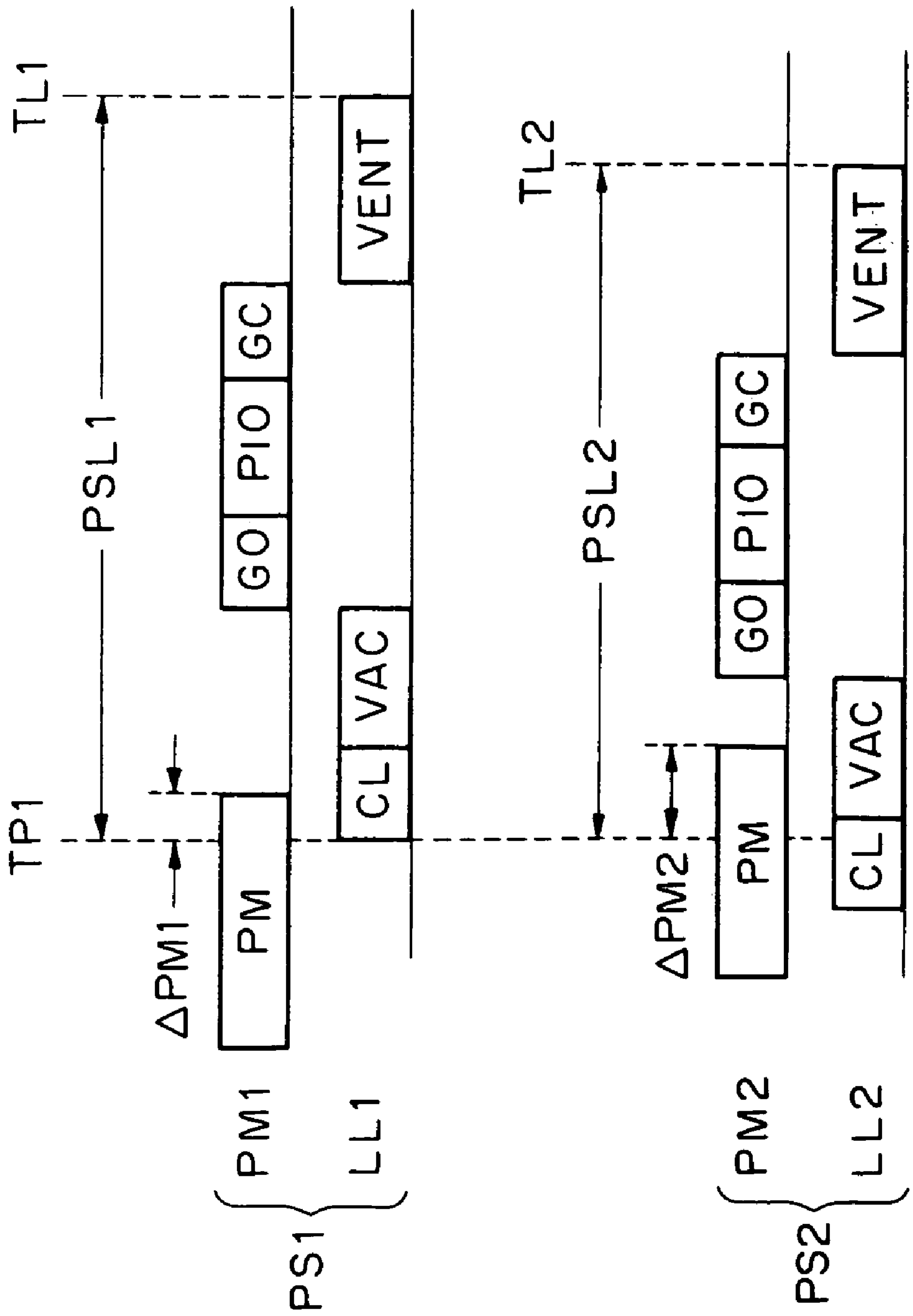
FIG. 3 is a diagram for explaining the transfer-in timings according to the first embodiment of the present invention.

FIG. 3 is a diagram for explaining transfer-in timings according to the first embodiment of the present invention. In FIG. 3, for example, when a wafer W is transferred into the load lock chamber LL1 at a time TP1, periods PSL1 and PSL2 for the process ships PS1 and PS2 to get ready to permit a transfer of the next wafer W thereinto are calculated based on this time TP1 respectively.

Here, it is assumed that, as a result of calculation of the PSL1 and PSL2, a time when the process ship PS1 gets ready to permit a transfer of the next wafer W thereinto is TL1, and a time when the process ship PS2 gets ready to permit a transfer of the next wafer W thereinto is TL2. In this case, when the transfer sequence of the next wafer W is decided in consideration of only the processing residual periods ΔPM in the process chambers PM1 and PM 2, a wafer to be transferred to the process ship PS1 is selected from the load ports LP1 to LP3 because the processing residual period ΔPM in the process chamber PM1 is shorter than the processing residual period ΔPM in the process chamber PM2. As a result of this selection, the transfer timing for the wafer W from the orienter OR delays by TL1−TL2 as compared to the case in which the wafer W is transferred into the process ship PS2 since the time when the wafer W can be transferred into the process ship PS1 is at TL1 which is later than TL2.

On the other hand, when the transfer sequence of the next wafer W is decided based on the periods PSL1 and PSL2 for the load lock chambers LL1 and LL2 to get ready to permit a transfer of the wafer W thereto, a wafer to be transferred to the process ship PS2 can be selected from the load ports LP1 to LP3 since the period PSL2 is shorter than the period PSL1, so that transfer delay can be reduced by TL1−TL2.

As described above, in the method of deciding the transfer sequence of the next wafer W based on the timings for when the load lock chambers LL1 and LL2 get ready to permit a transfer of the wafer thereto, selection can be made in a manner to give a priority to one of the process chambers PM1 and PM2 having a longer recipe period. This enables the wafer W to wait in the load lock chamber LL1 or LL2 in a state in which processing such as exhaust of air in the load lock chamber LL1 or LL2 is finished, and the wafer W can be immediately transferred into the process chamber PM1 or PM2. Consequently, it becomes possible to perform, without intermission, processing for a wafer W with a long recipe period and perform transfer of a wafer W with a short recipe period during the performance of the process processing for the wafer W with a long recipe period, whereby transfer delay can be reduced.

In the above-described first embodiment, the method of deciding the transfer sequence of a wafer W based on the timing for exchange of the wafers W between the load lock chambers LL1 and LL2 and the loader module LM, has been explained.

However, when the timing for when the load lock chamber LL1 or LL2 gets ready to permit transfer thereto is regarded as a base, a wafer W to be processed next in the process chamber PM1 or PM2 is kept waiting in the load lock chamber LL1 or LL2 if the recipe period for the wafer currently processed in the process chamber PM1 or PM2 is long. If such a state occurs to all of the process ships PS1 and PS2, transfers of wafers W in the load module LM are stopped during the period, and therefore wafers W are not taken out of the load ports LP1 to LP3. Such a state will cause a reduction in transfer depending on the process periods in the process chambers as a whole system, whereas performance of taking wafers W out of the load ports LP1 to LP3 without intermission can improve the transfer efficiency as a whole system.

Hence, it is also adoptable that, at a time when a wafer W is transferred into either the load lock chamber LL1 or LL2, periods PPS for the process chambers PM1 and PM2 to get ready to permit a transfer of the next wafer W thereinto are calculated based on the timing for exchange of the wafers W between the process chamber PM1 or PM2 and the load lock chamber LL1 or LL2.

Figure 4:
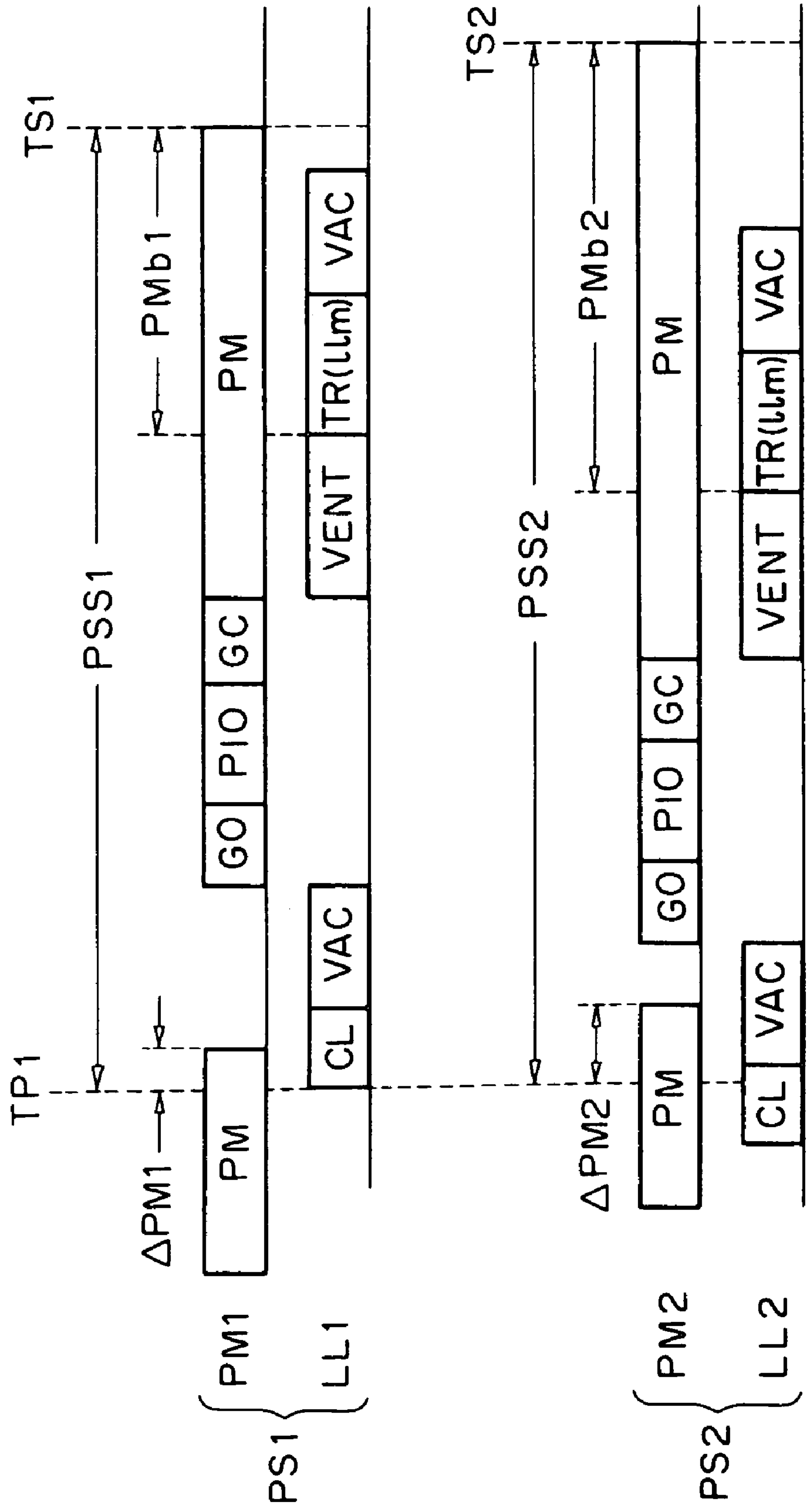
FIG. 4 is a diagram for explaining transfer-in timings according to a second embodiment of the present invention.

FIG. 4 is a diagram for explaining transfer-in timings according to a second embodiment of the present invention. In FIG. 4, for example, when a wafer W is transferred into the load lock chamber LL1 at a time TP1, periods PSS1 and PSS2 for the process chambers PM1 and PM2 to get ready to permit a transfer of the next wafer W thereinto are calculated based on this time TP1 respectively. To transfer the next wafer W into the process chamber PM1 or PM2, it is required here that the process processing for the wafer W transferred from the load lock chamber LL1 or LL2 into the process chamber PM1 or PM2 has been finished and the load lock chamber LL1 or LL2 has been vacuumed. Accordingly, it delays when the process chambers PM1 and PM2 getting ready to permit a transfer of the next wafer W thereinto by periods PMbl and PMb2 which are consumed for this processing, as compared to the periods PSS in FIG. 3, PSS1 and PSS2. Note that TR(ll*m*) in FIG. 4 represents an exchanging period in the load lock chamber LL1 or LL2.

Consequently, a time when the process chamber PM1 gets ready to permit a transfer of the next wafer W thereinto is TS1, and a time when the process chamber PM2 gets ready to permit a transfer of the next wafer W thereinto is TS2, and when the processing period in the process chamber PM2 is long, PSS1 becomes shorter than PSS2. Therefore, a wafer W to be transferred to the process ship PS1 can be selected from the load ports LP1 to LP3, so that selection can be made in a manner to give a priority to one having a shorter recipe period.

The periods PSS can be calculated as follows in accordance with the numbers of wafers W transferred in the process ships PS1 and PS2.

Specifically, the calculation of the period PSS is performed based on the timing for exchange of wafers W between the process chamber PM1 or PM2 and the load lock chamber LL1 or LL2. Therefore, it is only required to calculate a waiting period PMb for transfer-in during which the wafer W transferred into the load lock chamber LL1 or LL2 is kept waiting until it is transferred into the process chamber PM1 or PM2, and add this waiting period PMb for transfer-in to the period PSL.

Here, in the case of transfer of one wafer W in FIG. 2(*a*), in the case of transfer of two wafers W in which there is no wafer W in the process ship PS1 or PS2 in FIG. 2(*b*), and in the case of transfer of two wafers W in which there is one wafer W in the process ship PS1 or PS2 in FIG. 2(*e*), the waiting period PMb for transfer-in during which the wafer W transferred into the load lock chamber LL1 or LL2 is kept waiting until it is transferred into the process chamber PM1 or PM2 is 0, and therefore the equations here are the same as the equation (1), (2), and (5).

On the other hand, in the cases of transfer of two wafers W in which there are two wafers W in the process ship PS1 or PS2 in FIGS. 2(*c*) and 2(*d*), the period PSS can be obtained by adding PMb to the equations (3) and (4) respectively.

i) In the case without after-processing in the process chamber PM1 or PM2

$$PSS=\mathrm{Max}((CL+VAC),\Delta PM)+GO+PIO+GC+\mathrm{VENT}+PMb \quad (7)$$

ii) In the case with after-processing in the process chamber PM1 or PM2

$$PSS=\mathrm{Max}((CL+VAC),\Delta PM)+GO+PO+GC+APM+GO+PI+GC+\mathrm{VENT}+PMb \quad (8)$$

Note that PMb=PMa−Tll*m*

Tll*m*=VAC+TR(ll*m*)+VENT.

Here,

PMa: process period for the wafer W transferred into the load lock chamber LL1 or LL2

Tll*m*: processing period in the load lock chamber LL1 or LL2.

Besides, the recalculation when there is a wafer W on the orienter OR can be performed by the calculation method similar to that of the equation (6) except that PMo is used in place of PMa in the equations (7) and (8). Note that PMo represents the process processing period for the wafer W on the orienter OR.

While the cases, in which two process ships PS1 and PS2, three load ports LP1 to LP3, and only one orienter OR are provided, have been explained in the above-described embodiments, it is also adoptable to provide any number of process ships PS1 and PS2 as long as they are two or more, any number of load ports LP1 to LP3 as long as there is one or more, and two orienters OR on both sides of the transfer chamber TR.

Further, the method of transfer with the load port gates CG1 to CG3 kept open has been described, but the load port gates CG1 to CG3 may be temporarily closed when there is spare time before performance of transfer.

Furthermore, in the above-described embodiments, the transfer chamber TR which is kept open to atmospheric air has been described as an example, but vacuum drawing of the transfer chamber TR may be performed. Besides, the case in which two of the wafer mounting tables B11, B12, B21, and B22 are provided in each of the load lock chambers LL1 and LL2 has been described, but it is also adoptable to provide one wafer mounting table for each, and configure the load lock arms LR1 and LR2 to serve also as the wafer mounting table. Furthermore, the loader arms LA1 and LA2 have been described with a case in which they are accessible to the wafer mounting tables B11 and B21 on the front side, but they may be configured to directly access the wafer mounting tables B12 and B22 on the back side. In addition, the loader arms LA1 and LA2 in a two-tire structure have been described, but a one-tier loader arm is also applicable.

Industrial Applicability

A cluster tool and a transfer control method according to the present invention are usable in the semiconductor manufacturing industry in which semiconductor devices are manufactured, and so on. Therefore, they have industrial applicability.

What is claimed is:

1. A cluster tool, comprising:

a plurality of process chambers for performing process processing for objects to be processed;

load lock chambers coupled to said process chambers respectively for transferring the objects to be processed to said process chambers;

a loader module coupled to said load lock chambers for transferring the objects to be processed to said load lock chambers, the loader module being provided with a positioning mechanism for positioning the object to be processed; and a transfer control unit including a transfer period calculating unit for calculating a period for each of the load lock chambers to get ready to permit a next transfer thereto, when the object to be processed is transferred into any one of the load lock chambers, based on a processing period in the process chamber coupled to each of the load lock chambers and a processing period in each of the load lock chambers, and a selecting unit for selecting, as an object to be processed that is to be transferred next by the loader module, an object to be processed having the shortest period to get ready to be transferable, based on a calculation result of the transfer period calculating unit.

2. The cluster tool as set forth in claim 1, wherein the object to be processed that is to be transferred next selected by said transfer control unit is positioned by said positioning mechanism, thereafter transferred to the front of said load lock chamber, and kept waiting.

3. A cluster tool, comprising:

a plurality of process chambers for performing process processing for objects to be processed;

load lock chambers coupled to said process chambers respectively for transferring the objects to be processed to said process chambers;

a loader module coupled to said load lock chambers for transferring the objects to be processed to said load lock chambers, the loader module being provided with a positioning mechanism for positioning the object to be processed; and a transfer control unit including a transfer period calculating unit for calculating a period for each of the process chambers to get ready to permit a next transfer thereto, when the object to be processed is transferred into any one of the load lock chambers, based on a processing period in each of the process chambers and a processing period in the load lock chamber coupled to each of the process chambers, and a selecting unit for selecting, as an object to be processed that is to be transferred next by the loader module, an object to be processed having the shortest period to get ready to be transferable, based on a calculation result of the transfer period calculating unit.

4. The cluster tool as set forth in claim 3, wherein the object to be processed that is to be transferred next selected by said transfer control unit is positioned by said positioning mechanism, thereafter transferred to the front of said load lock chamber, and kept waiting.

5. The cluster tool as set forth in claim 1, wherein the processing period in the load lock chamber includes at least a period of exhausting air in the load lock chamber and a period of opening of the load lock chamber to an atmospheric air.

6. The cluster tool as set forth in claim 3, wherein the processing period in the load lock chamber includes at least a period of exhausting air in the load lock chamber and a period of opening of the load lock chamber to an atmospheric air.

7. The cluster tool as set forth in claim 1, wherein the transfer period calculating unit calculates the period for each of the load lock chambers to get ready to permit a next transfer thereto based on a timing for exchange of the objects to be processed between the load lock chamber and the loader module.

8. The cluster tool as set forth in claim 5, wherein the transfer period calculating unit calculates the period for each of the process chambers to get ready to permit a next transfer thereto based on a timing for exchange of the object to be processed between the process chamber and the load lock chamber.

9. The cluster tool as set forth in claim 1, wherein the transfer period calculating unit performs a correction of the period for each of the load lock chambers to get ready to permit a next transfer thereto by a period for the load lock chamber that is the destination to get ready to permit a transfer of the object to be processed on the positioning mechanism thereinto.

10. The cluster tool as set forth in claim 3, wherein the transfer period calculating unit performs a correction of the period for each of the process chambers to get ready to permit a next transfer thereto by a period for the load lock chamber that is the destination to get ready to permit a transfer of the object to be processed on the positioning mechanism thereinto.

* * * * *